United States Patent
Yoshikawa et al.

(10) Patent No.: US 6,828,503 B2
(45) Date of Patent: Dec. 7, 2004

(54) TERMINAL BOX DEVICE FOR A SOLAR CELL MODULE AND A CONNECTING METHOD FOR A TERMINAL BOX DEVICE

(75) Inventors: Hiroyuki Yoshikawa, Yokkaichi (JP); Makoto Higashikuzono, Yokkaichi (JP); Tadashi Sugino, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 10/753,944

(22) Filed: Jan. 8, 2004

(65) Prior Publication Data
US 2004/0177987 A1 Sep. 16, 2004

(30) Foreign Application Priority Data
Jan. 8, 2003 (JP) ........................................ 2003-001943
Jan. 21, 2003 (JP) ........................................ 2003-012017
Dec. 4, 2003 (JP) ........................................ 2003-405402

(51) Int. Cl.⁷ .............................................. H02G 3/08
(52) U.S. Cl. ........................... 174/50; 174/58; 439/535; 220/4.02
(58) Field of Search .............................. 174/50, 58, 59, 174/60, 52.1; 220/3.94, 4.02, 3.8; 439/535

(56) References Cited

U.S. PATENT DOCUMENTS

| | | | | |
|---|---|---|---|---|
| 4,623,753 A | * | 11/1986 | Feldman et al. | 174/50 |
| 6,207,896 B1 | * | 3/2001 | Toyomura | 174/58 |
| 6,344,612 B1 | | 2/2002 | Kuwahara et al. | |
| 6,608,253 B1 | * | 8/2003 | Rintz | 174/66 |
| 2002/0117200 A1 | | 8/2002 | Yoshikawa et al. | |

FOREIGN PATENT DOCUMENTS

| | | |
|---|---|---|
| JP | 11-26035 | 1/1999 |
| JP | 2001-119058 | 4/2001 |
| JP | 2002-57360 | 2/2002 |
| JP | 2002-252356 | 9/2002 |

* cited by examiner

Primary Examiner—Dhiru R. Patel
(74) Attorney, Agent, or Firm—Gerald E. Hoopos; Anthony J. Casella

(57) ABSTRACT

Connecting terminals (25a to 25d) are accommodated side by side in a terminal box casing (21). Diodes (30a to 30c) are connected electrically between the respective connecting terminals (25a to 25d). The diodes (30a to 30c) are connected in series via the intermediate terminal mounts (28a, 28b). Partition walls (24) for partitioning diode accommodation spaces (23a to 23c) for at least partly accommodating the diodes (30a to 30c) are formed in the terminal box casing (21).

14 Claims, 10 Drawing Sheets

TERMINAL BOX DEVICE FOR A SOLAR CELL MODULE AND A CONNECTING METHOD FOR A TERMINAL BOX DEVICE

BACKGROUND OF THE INVENTION

1. Field of the Invention

The invention relates to a terminal box device for a solar cell module and a connecting method for such a terminal box device.

2. Description of the Related Art

A known system for generating solar energy arranges solar cell modules in matrix on a roof of a house or the like. Terminal box devices are provided for connecting the solar cell modules with other solar cell modules.

Japanese Unexamined Patent Publication No. 2002-252356 discloses a known terminal box device with built-in bypass diodes. The bypass diodes are connected in parallel with solar cells contained in the solar cell module and are reverse-biased with respect to the output polarity of the respective solar cells. A current of this solar cell is bypassed to the bypass diode if a reverse bias voltage is applied to the solar cell.

Other technologies relating to the terminal box device for a solar cell device are disclosed in Japanese Unexamined Patent Publication No. 2002-57360, Japanese Unexamined Patent Publication No. 2001-119058 and Japanese Unexamined Patent Publication No. H11-26035.

The diode in the aforementioned terminal box device generates heat due to the current flowing therethrough. For example, the terminal box device disclosed in Japanese Unexamined Patent Publication No. 2002-252356, has a plurality of adjacent diodes connected in series and disposed in a single casing. This entire solar cell module takes a negative polarity. Thus, adjacent diodes may experience a synergistic thermal influence by each other to increase the temperature of the diodes considerably if the currents run through all the diodes connected in series. Diodes that reach an abnormally high temperature in this way may, in a worst-case scenario, be short-circuited.

Moreover, the aforementioned diode has a poor thermal conductivity since the upper lead plate is formed with slits and a waist portion and is relatively thin. Thus, heat developed by the rectifying-element main body is difficult to radiate from the upper lead plate to the outside, and a junction temperature of the rectifying-element main body is likely to increase.

In view of the above problem, an object of the present invention is to suppress or reduce temperature increases of rectifying elements.

SUMMARY OF THE INVENTION

The invention relates to a terminal box device for a solar cell module. The terminal box device comprises a terminal box casing. Connecting terminals are arranged in the terminal box casing and are connected with a plurality of connecting elements from photoelectric conversion elements of the solar cell module. Two of the connecting terminals are adapted to connect with a pair of connection cables so that the connection cables can be drawn out from the terminal box casing. The terminal box casing comprises accommodating spaces for accommodating rectifying elements to be connected electrically between the adjacent connecting terminals, and the respective rectifying elements are to be connected in series via intermediate terminal mounts in the terminal box casing. Thus, heat developed in the rectifying elements becomes difficult to transfer to the adjacent rectifying elements. Accordingly, temperature increases of the rectifying elements due to the mutual thermal influence of the rectifying elements are suppressed.

The terminal box device may further have at least one partition wall partitioning the accommodating spaces for the respective rectifying elements.

A filler preferably is filled at least partly in the terminal box casing and/or an air layer is formed inside the partition wall.

The terminal box device may further comprise a partition wall for partitioning the rectifying elements and a filler in the terminal box casing. The partition wall suppresses heat transfer through the filler, and temperature increases of the rectifying elements are suppressed more effectively.

The terminal box device may further comprise a partition wall in the terminal box casing for partitioning the respective rectifying elements, and an air layer may be formed inside the partition wall. Accordingly, heat transfer from one rectifying element to another is suppressed by the air layer in the partition wall, and temperature increases of the rectifying elements are suppressed more effectively.

The connecting terminals may be arranged substantially side by side at substantially even intervals and the intermediate terminal mounts may be arranged at the outer sides of the respective connecting terminals. Accordingly, a plurality of connecting elements from the photoelectric conversion elements of the solar cell module can be connected at substantially even intervals.

A pin-shaped connecting member may be used between the intermediate terminal mount and the connecting terminal connected with the intermediate terminal mount. Accordingly, heat transfer from the rectifying element to other rectifying elements via the pin-shaped connecting member is suppressed, and temperature increases of the rectifying elements are suppressed more effectively.

A non-linear connecting member may be used between the intermediate terminal mount and the connecting terminal that is connected with the intermediate terminal mount. Accordingly, heat becomes difficult to transfer from one rectifying element to another, and temperature increases of the rectifying elements are suppressed more effectively.

Part of the nonlinear connecting member may be located outside the terminal box casing. Accordingly, heat is radiated at a portion of the connecting member outside the terminal box casing and heat becomes difficult to transfer from one rectifying element to another. Thus, temperature increases of the rectifying elements are suppressed more effectively.

The invention also relates to a terminal box device for a solar cell module. The terminal box device comprises a terminal box casing with a plurality of rectifying element accommodating spaces for accommodating a plurality of rectifying elements. Each rectifying-element has a main body, a first lead terminal and a second lead terminal that has a better thermal conductivity than the first lead terminal. The terminal box device also includes a plurality of terminal pairs corresponding to the number of the rectifying elements. Each terminal pair includes a first terminal to be connected with the first lead terminal, a second terminal to be connected with the second lead terminal, and at least one radiating intermediate terminal for connecting at least one pair of the first and second terminals to be connected with the adjacent rectifying elements such that the respective rectifying elements can be connected in series. Accordingly, the terminal box device for a solar cell module has an excellent property of radiating the heat of rectifying elements.

The invention also relates to a terminal box device for a solar cell module where rectifying elements are provided in a terminal box casing. Each rectifying element has a main body with first and second electrodes. A first lead terminal is connected with the first electrode, and a second lead terminal is connected with the second electrode. The second lead terminal has a better thermal conductivity than the first lead terminal. Terminal pairs are provided and correspond to the number of the rectifying elements. Each terminal pair has a first terminal connected with the first lead terminal and a second terminal connected with the second lead terminal. At least one radiating intermediate terminal for connecting the first and second terminals is connected with the adjacent rectifying elements such that the respective rectifying elements are connected in series.

As described above, heat developed by the rectifying-element main body is transferred from the second lead terminal having a relatively higher heat radiating property to the second terminal and then further to the first terminal connected with the adjacent rectifying element via the radiating intermediate terminal. The heat is radiated in these respective heat transfer paths. Thus, the rectifying element has a good heat radiating property.

The first lead terminal may be a plate, and the second lead terminal may be made to have a better thermal conductivity than the first lead terminal by forming the first lead terminal with a smaller cross-sectional area than the second lead terminal. For example, the first lead terminal may be thinner than the second lead terminal and/or the first lead terminal may have at least one slit and/or the first lead terminal may have a waist portion. Accordingly, thermal stresses on portions connecting the rectifying-element main body and the first and second lead terminals can be alleviated since the first lead terminal is easily resiliently deformable.

The first terminal, the second terminal and/or the radiating intermediate terminal may be substantially flat plates. Accordingly, heat can be radiated efficiently from the first terminal, the second terminal and the radiating intermediate terminal.

The radiating intermediate terminal preferably is formed integrally or unitarily with the first terminal and/or the second terminal for intermediate connection. Accordingly, an assembling operability of the terminal box device is improved and heat can be transferred more efficiently to provide a better heat radiating property.

The invention also relates to a method for connecting a lead terminal and a terminal in a terminal box casing of a terminal box device. The terminal box device may be one of the above-described terminal box devices for a solar cell module. The terminal box device may include a terminal box casing for a plurality of rectifying elements each including the lead terminal and the terminal to be connected with the lead terminal. The method preferably comprises placing the terminal and the lead terminal one over the other with solder therebetween. The method then includes holding a pair of electrodes in contact with the lead terminal and the terminal and applying a current between the pair of electrodes to heat the solder, thereby soldering the lead terminal and the terminal. Accordingly, the solder between the lead terminal and the terminal is heated to solder the lead terminal and the terminal.

Alternatively, the method may employ resistance welding. Thus, the lead terminal and the terminal are joined merely by applying a current between the electrodes. Thus, the connecting operation is performed in a relatively short period.

This connecting method can be applied in a case where at least one of the first and second lead terminals is connected with the corresponding one of the first and second terminals upon producing the terminal box device for a solar cell module.

The method may include forming operation holes in portions of the terminal box casing where the lead terminal and the terminal are to be connected. The rectifying elements and the terminal may be fixedly accommodated in the terminal box casing, and the electrodes may be brought into contact with the lead terminal and the terminal through the operation holes, thereby connecting the lead terminal and the terminal by soldering and/or resistance welding.

These and other objects, features and advantages of the invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
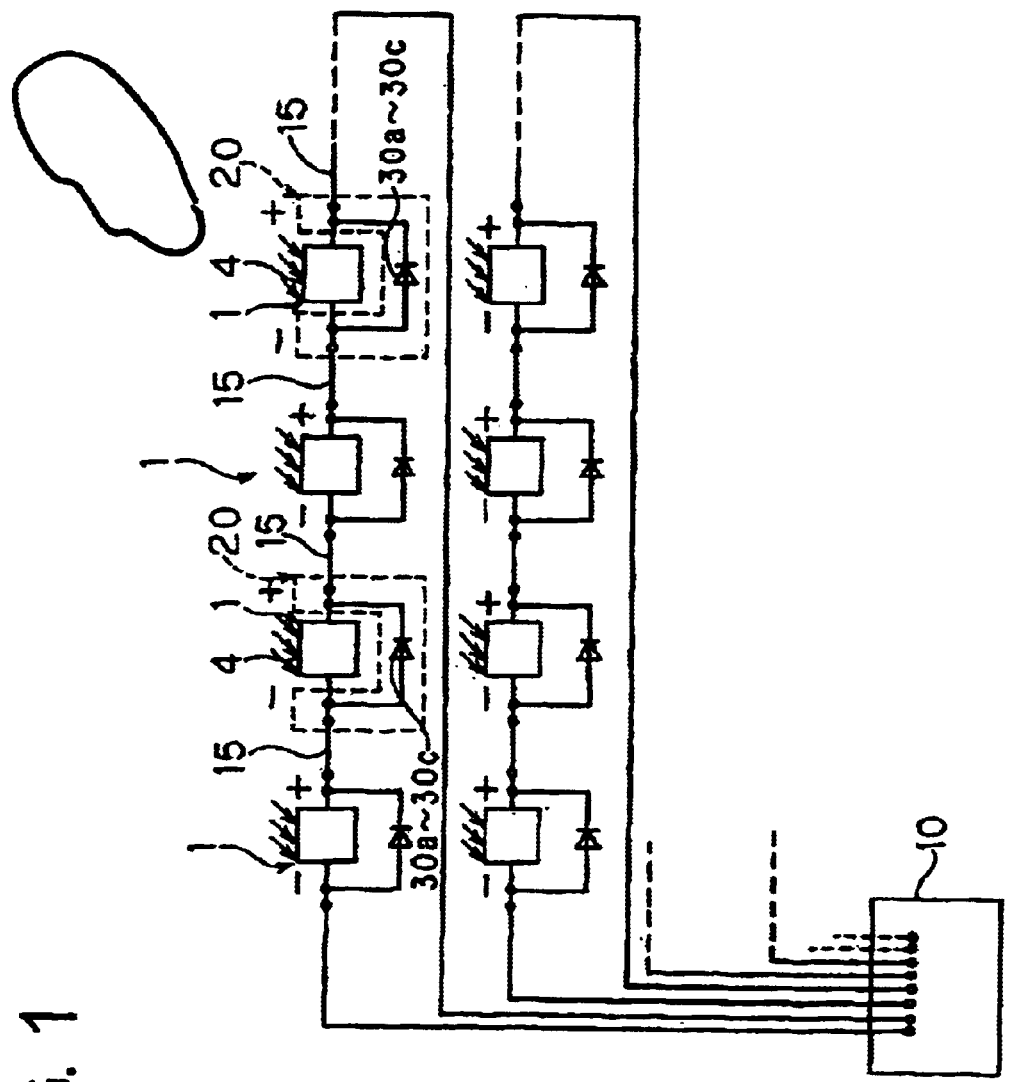
FIG. 1 is a block diagram showing an electrical construction of a solar generating system.

FIG. 1 is a block diagram showing an electric construction of the solar generating system. This solar generating system is provided with solar cell modules 1, terminal box devices 20 to be equipped for the respective solar cell modules 1 and at lest one connecting box 10. The respective solar cell modules 1 each have a plurality of solar cells 4 electrically connected in series and arranged in a substantially two-dimensional matrix on a roof of a house, solar cell farm or the like to receive a natural sun light.

The terminal box device 20 is mounted, for example, on the underside of each solar cell module 1 and connects the solar cell module 1 with the other solar cell modules 1 and/or with the external connecting box 10.

Bypass diodes 30a to 30c are connected in series and function as rectifying elements in the terminal box device 20. The respective diodes 30a to 30c are connected in parallel while being reverse-biased with respect to the output polarity of the respective solar cells 4 (or cell groups each comprised of a plurality of solar cells 4). Thus, if a reverse bias voltage is applied to a specific solar cell 4, for example, because no sun light falls on this solar cell 4, the current running through this solar cell 4 is bypassed to the diodes 30a to 30c.

One diode 30a to 30c is provided for each solar cell 4 (or each cell group) in each solar cell module 1. Thus, in this embodiment, three diodes 30a to 30c are provided for one solar cell module 1 (see FIG. 2). In FIG. 1, only one diode 30a to 30c is shown for one solar cell module 1.

Each solar cell module 1 is connected with the other adjacent solar cell modules 1 via connection cables 15 drawn out by way of the terminal box device 20 mounted on the underside thereof. The solar cell modules 1 are connected electrically in series.

Two connection cables 15 are drawn out from the solar cell module 1 and are connected with the connecting box 10, an inverter or the like for taking electric energies out from the respective solar cell modules 1. Thus, the electric energies are converted into an alternate current and are taken out.

Figure 2:
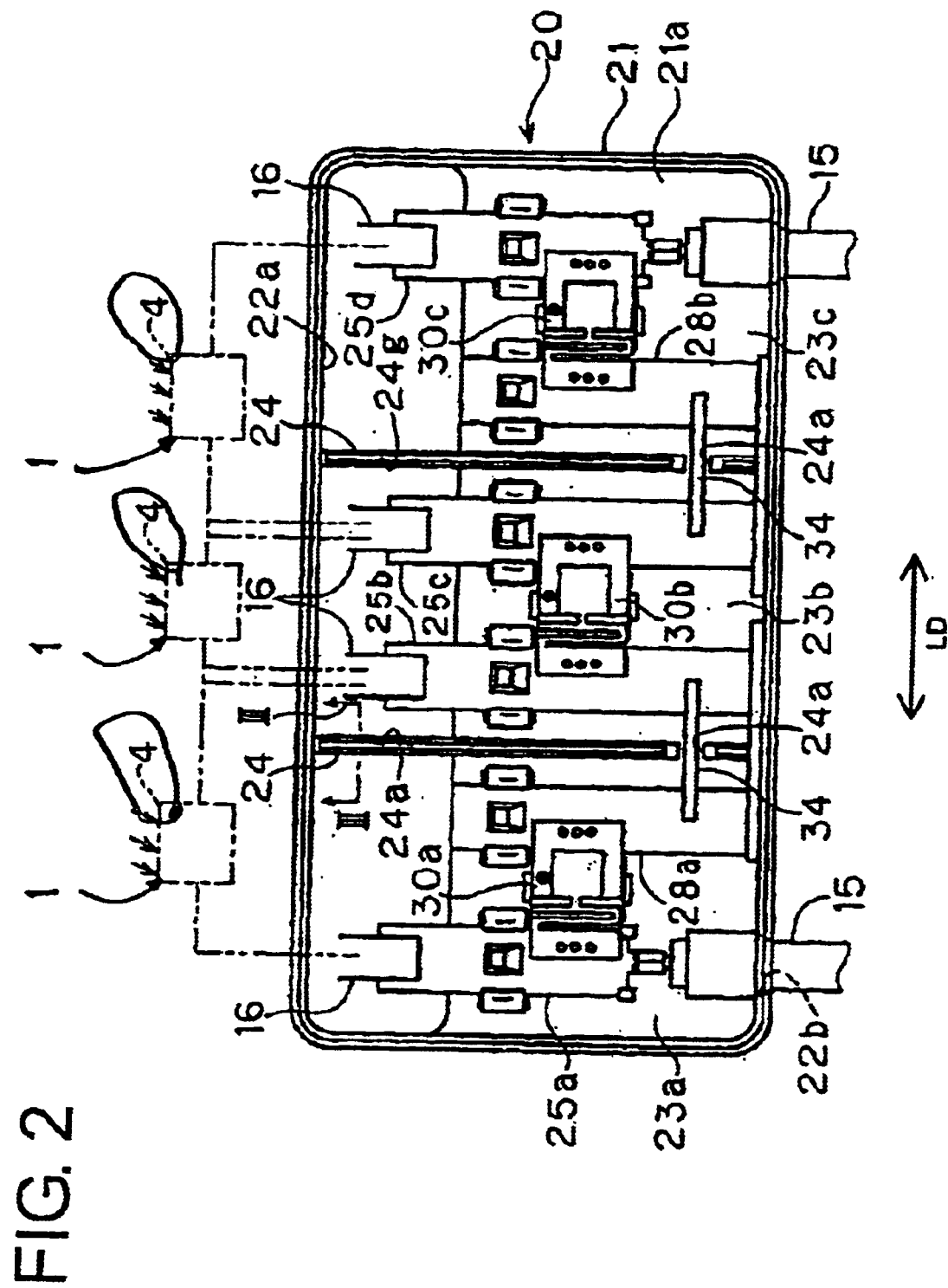
FIG. 2 is a plan view of a terminal box device for a solar cell module according to one embodiment of the invention.

The terminal box device 20 has a terminal box casing 21, connecting terminals 25a to 25d, the connection cables 15 and diodes 30a to 30c, as shown in FIG. 2. The terminal box casing 21 is made e.g. of a synthetic resin and includes a box main body 21a with a substantially rectangular casing structure that has an open end defining an accommodating recess. A plate-shaped lid (not shown) is mountable on the upper opening of the box main body 21a to close the accommodating recess.

Wiring holes 22a are formed along one side (upper side in FIG. 2) of the bottom surface of the box main body 21a, and two cable introducing holes 22b are formed at the opposite ends of a side wall at the other side (lower side in FIG. 2) of the box main body 21a.

Ends of lead frames 16 are drawn out from the respective solar cells 4 or cell groups of the solar cell module 1 and are pulled into the terminal box casing 21 through the wiring holes 22a. The connection cables 15 are introduced through the respective cable introducing holes 22b and connect the solar cell modules 1 or the connection cables 15 used to transfer an electric power from the solar cell module 1 to the outside.

Two partition walls 24 are formed in the terminal box casing 21 for partitioning the accommodating recess into three diode accommodating spaces 23a to 23c one after another along the longitudinal direction LD. A single diode 30a to 30c is accommodated in each diode accommodating space 23a to 23c. Thus, the partition walls 24 partition the respective diodes 30a to 30c.

Each partition wall 24 is formed with a pin insertion groove 24a, into which a jumper pin 34 is inserted.

Figure 3:
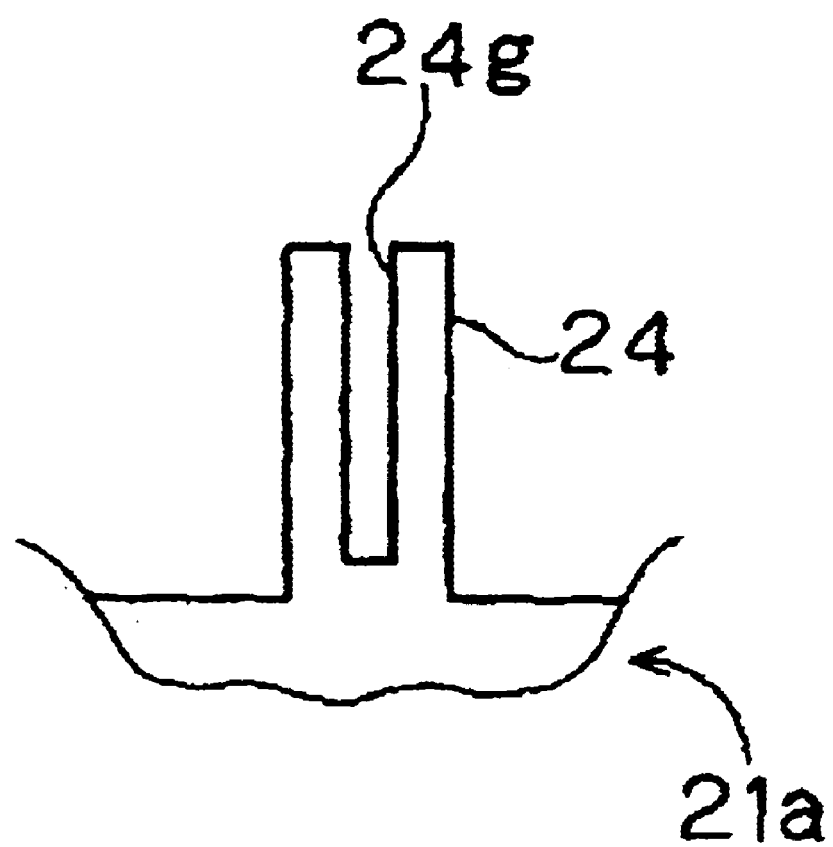
FIG. 3 is a section along 3—3 of FIG. 2.

Recessed grooves 24g are formed in parts of the partition walls 24 spaced from the pin insertion grooves 24a and extend substantially along the surfaces of the partition walls 24. Thus, air layers are formed in the recessed grooves 24g (see FIG. 3).

Four connecting terminals 25a to 25d are fixed side by side in the terminal box casing 21. One end of each of the connecting terminals 25a, 25d is connected with an end of the lead frame 16 drawn out from each solar cell 4 or cell group of the solar cell module 1, for example, by soldering, and the other end is connected with the connection cable 15, for example, by crimping. The connecting terminals 25a, 25d are in the two diode accommodating spaces 23a, 23c at the opposite ends, out of the box main body 21a.

One end of each of the other two connecting terminals 25b, 25c is connected with an end of the lead frame 16 drawn out from each solar cell 4 or each cell group of the solar cell module 1. The connecting terminals 25b, 25c are accommodated substantially side by side in the intermediate diode accommodating space 23b and are spaced apart by a specified distance.

The three diodes 30a to 30c are accommodated respectively in the diode accommodating spaces 23a to 23c. Each diode 30a to 30c in this embodiment has a connection lead terminal and a lead plate mounted on the upper and lower surfaces of a chip-shaped bare chip diode. The lead plate functions as a radiating plate. In FIG. 2, the lead plate at one side of each diode 30a to 30c is formed with a zigzag portion to alleviate stress that will act on a portion connecting the bare chip diode and each lead plate due to temperature changes or the like.

The respective diodes 30a to 30c are connected in series via intermediate terminal mounts 28a, 28b in the terminal box casing 21. Specifically, one intermediate terminal mount 28a, 28b is fixed in each of the diode accommodating spaces 23a, 23c at the opposite ends. The connecting terminals 25a to 25d and a pair of intermediate terminal mounts 28a, 28b are arranged substantially side by side at substantially even intervals. One intermediate terminal mount 28a in the diode accommodating space 23a is between the connecting terminals 25a, 25b and is fixed substantially in parallel with the connecting terminals 25a, 25b. The other intermediate terminal mount 28b in the diode accommodating space 23c is between the connecting terminals 25c, 25d and is fixed substantially in parallel with the connecting terminals 25c, 25d.

The diodes 30a, 30b in the diode accommodating spaces 23a, 23c at the opposite ends of the terminal box device 20 have ends of the lead plates at one side soldered to the connecting, terminals 25a, 25d, and have ends of the lead plates thereof at the other side soldered to the intermediate terminal mounts 28a, 28b.

Further, the connecting terminals 25b, 25c in the intermediate diode accommodating space 23b are connected electrically with the respective intermediate terminal mounts 28a, 28b via the jumper pins 34. Specifically, one end of each of the two narrow linear jumper pins 34 is connected to the intermediate terminal mount 28a, 28b, for example, by soldering, and the other end thereof is pulled into the middle diode accommodating space 23b through the pin insertion groove 24a of each partition wall 24 and connected with the connecting terminal 25b, 25c inside, for example, by soldering.

In this way, the diodes 30a, 30c are between the connecting terminals 25a, 25b and between the connecting terminals 25c, 25d. The diode 30a is connected in parallel with the solar cells 4 (or group of the solar cells 4) connected with the connecting terminals 25a, 25b, and the diode 30c is connected in parallel with the solar cells 4 (or group of the solar cells 4) connected with the connecting terminals 25c, 25d.

Further, in the middle diode accommodating space 23b, the lead plate of the diode 30b at one side is connected with the connecting terminal 25b, for example, by soldering, and the lead plate at the other side is connected with the connecting terminal 25c, for example, by soldering. In this way, the diode 30b is between a pair of connecting terminals 25b, 25c. It should be noted that the diode 30b is connected in parallel with the solar cells 4 (or group of the solar cells 4) connected with the connecting terminals 25b, 25c.

This terminal box device 20 is assembled by mounting the lid on the opening of the terminal box casing 21 preferably with an insulating filler such as a silicone potting agent at least partly filled in the accommodating recess of the terminal box casing 21.

The diodes 30a to 30c of the terminal box device 20 are connected in series by disposing the intermediate terminal mount 28a between the diodes 30a, 30b and disposing the intermediate terminal mount 28b between the diode 30b, 30c. Accordingly, heat developed by the specified diodes 30a, 30c is difficult to transfer to the adjacent diodes 30a to 30c, and temperature increases of the diodes 30a to 30c is suppressed by preventing the mutual thermal influences of the diodes 30a to 30c.

The respective diodes 30a to 30c are partitioned by the partition walls 24. Thus, heat transfer through the filler in the terminal box casing 21 is suppressed by the partition walls 24. Temperature increases of the diodes 30a to 30c also are suppressed by preventing the mutual thermal influences of the diodes 30a to 30c. The air layers in the partition walls 24 further suppress heat transfer.

Furthermore, the narrow linear jumper pins 34 that connect the intermediate terminal mounts 28a, 28b and the connecting terminals 25b, 25c have a relatively small sectional area. In this respect as well, heat transfer between the diodes 30a to 30c is suppressed and the temperature increases of the diodes 30a to 30c is suppressed more effectively.

Figure 4:
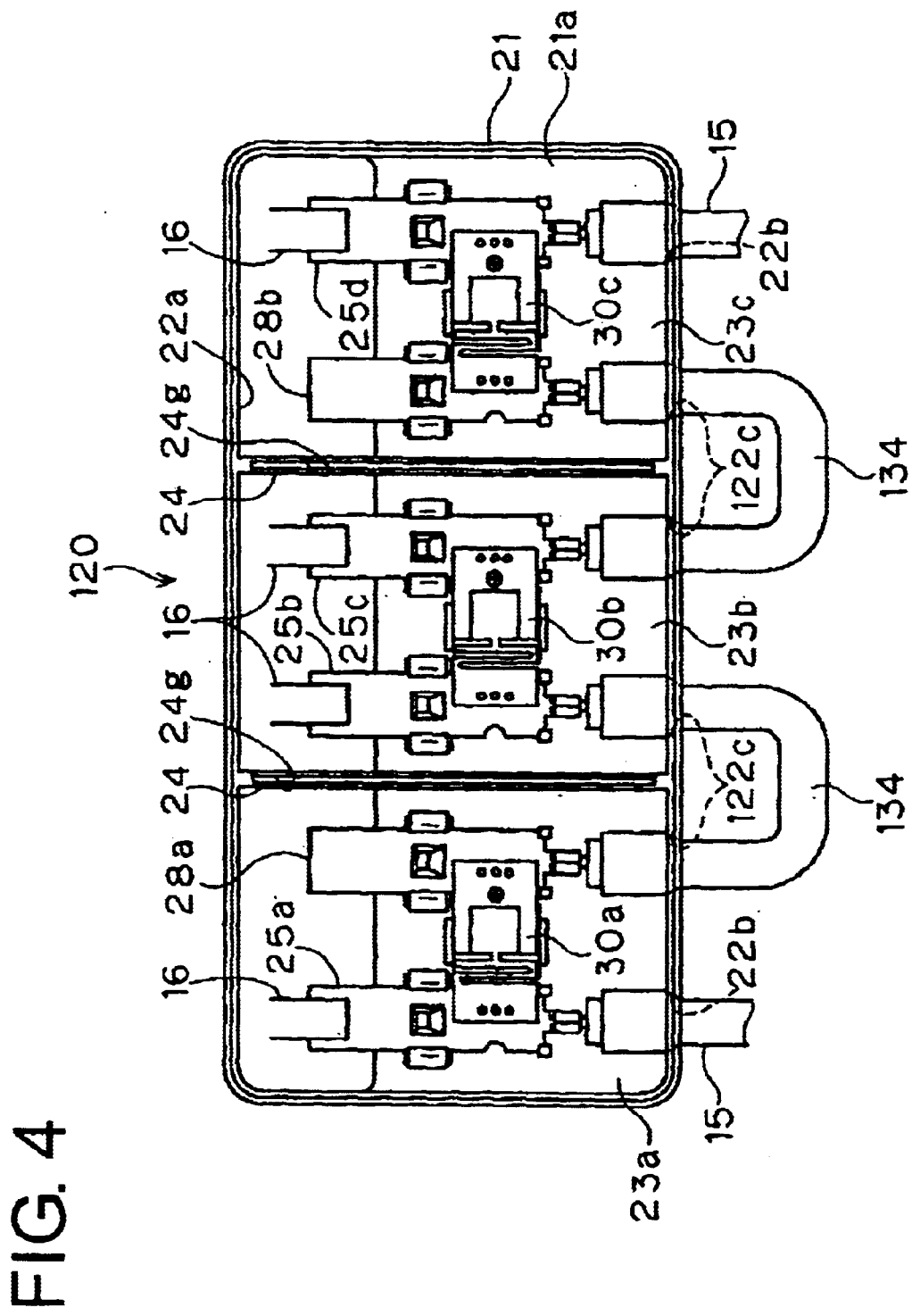
FIG. 4 is a plan view of a terminal box device according to a first modification.

A terminal box device 120 according to a first modification is described with reference to FIG. 4. The description of the terminal box device 120 centers on differences from the foregoing embodiment while the same or similar elements as those of the foregoing embodiment are not described but merely are identified by the same reference numerals.

The terminal box device 120 is formed with four intermediate-cable introducing holes 122c at positions on a side wall (lower side in FIG. 4) corresponding to the intermediate terminal mounts 28a, 28b and the connecting terminals 25b, 25c.

Further, two intermediate cables 134 that have cores covered by insulation coatings are used instead of or in addition to the jumper pins 34. One end of each intermediate cable 134 is connected with the intermediate terminal mount 28a, 28b, for example, by crimping, whereas the other end thereof is connected with the connecting terminal 25b, 25c, for example, by crimping. A longitudinal middle portion of each intermediate cable 134 is exposed to the outside from the terminal box casing 21. Specifically, the longitudinal middle portion of each intermediate cable 134 is drawn out of the terminal box casing 21 through the intermediate-cable introducing hole 122c and then pulled into the terminal box casing 21 again through another intermediate-cable introducing hole 122c. Thus, a portion of the intermediate cable 134 outside the terminal box casing 21 is bent in a nonlinear manner.

The nonlinear intermediate cables 134 create a longer heat transfer paths between the intermediate terminal mounts 28a, 28b and the connecting terminals 25b, 25c in the terminal box device 120 of this modification. Thus, heat transfer between the diodes 30a to 30c is more difficult and temperature increases of the diodes 30a to 30c is suppressed more effectively. It should be noted that the intermediate cables 134 are preferably as long as possible to make the heat transfer difficult.

Further, heat is radiated more easily to the outside because the longitudinal middle portions of the intermediate cables 134 are outside the terminal box casing 21. Thus, heat being transferred between the diodes 30a to 30c is radiated in an intermediate position, and temperature increases of the diodes 30a to 30c is suppressed more effectively.

Figure 5:
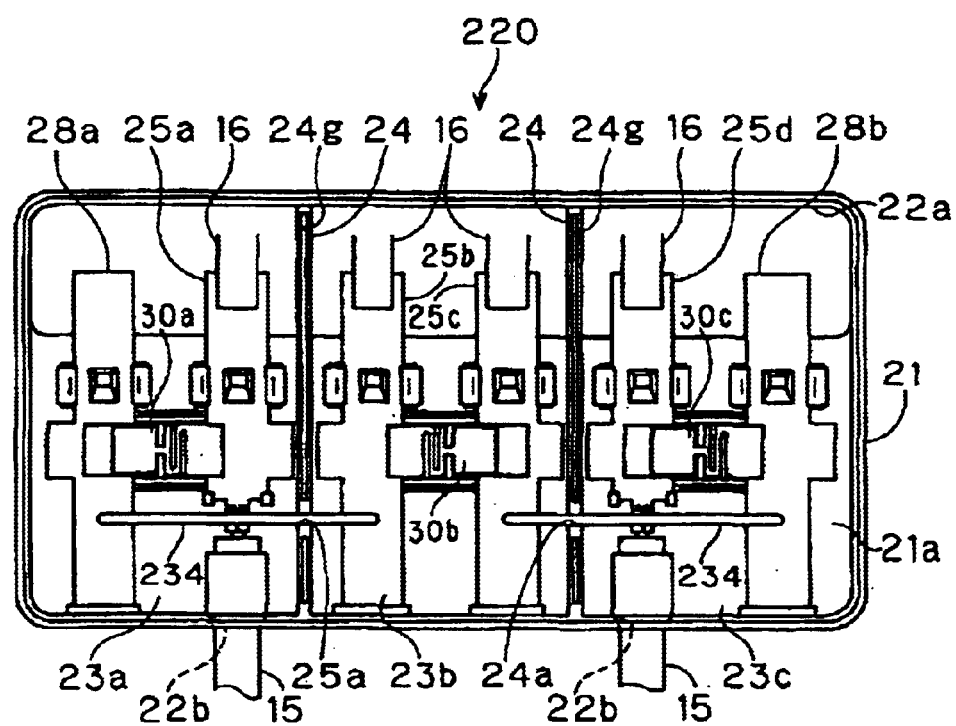
FIG. 5 is a plan view of a terminal box device according to a second modification.

A terminal box device 220 according to a second modification is described with reference to FIG. 5. The description of the terminal box device 220 centers on differences from the foregoing embodiment while the same elements as those of the foregoing embodiment are not described and merely identified by the same reference numerals.

The positions of the connecting terminals 25a, 25d and those of the intermediate terminal mounts 28a, 28b are switched in the diode accommodating spaces 23a, 23b at the opposite ends of the terminal box device 220. Thus, the intermediate terminal mounts 28a, 28b are at the outer sides of the connecting terminals. 25a, 25d. Accordingly, the physical orientations of the diodes 30a, 30c are reversed (direction of electrical connection or circuitry is same), and the connecting terminals 25a, 25d and the intermediate terminal mounts 28a, 28b are connected using relatively long jumper pins 234 to cross over the connecting terminals 25a, 25d.

Accordingly, the respective connecting terminals 25a to 25d are arranged substantially side by side at substantially even intervals. As a result, the lead frames 16 from the solar cells 4 (or groups of the solar cells 4) of the solar cell module can be arranged at substantially even intervals.

Figure 6:
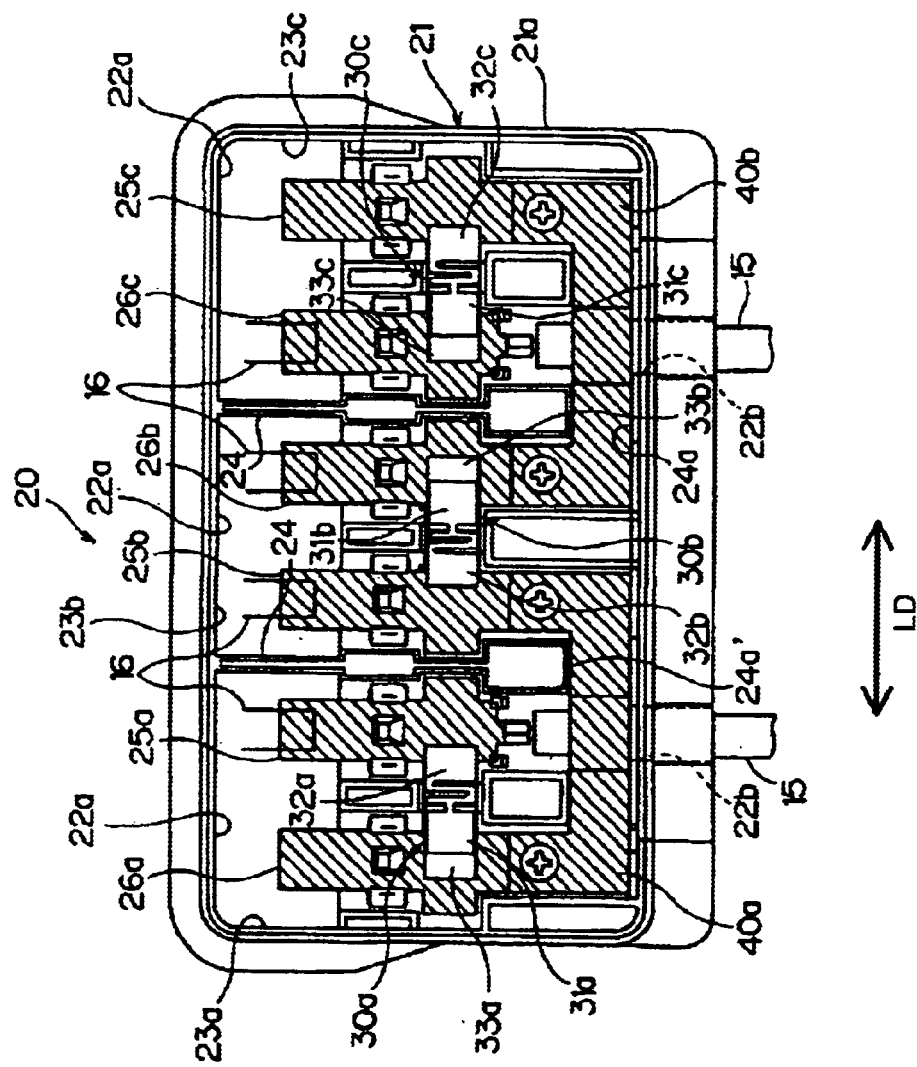
FIG. 6 is a schematic plan view of a terminal box device for a solar cell module according to a second embodiment of the invention.
Figure 7:
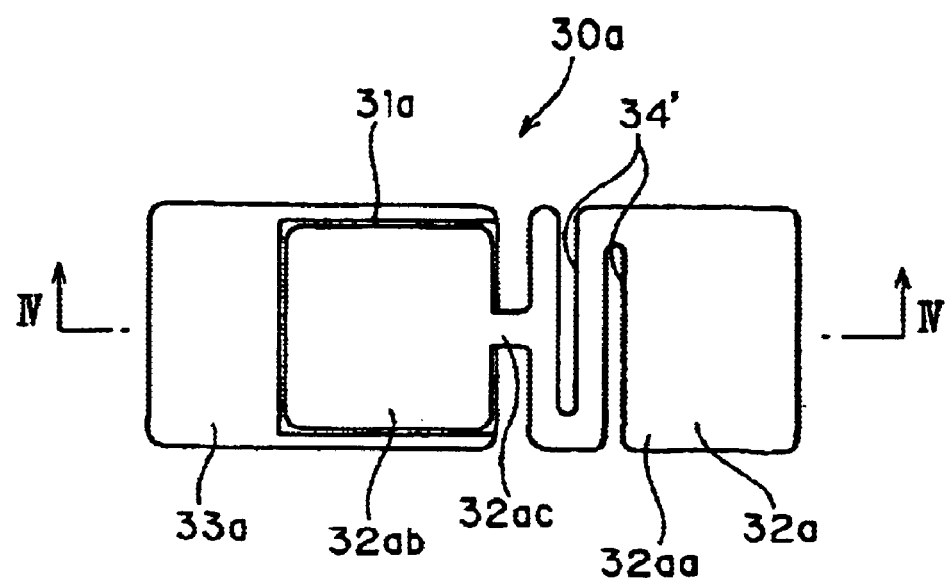
FIG. 7 is a partial enlarged plan view of a bypass diode used in the terminal box device of FIG. 6.
Figure 8:
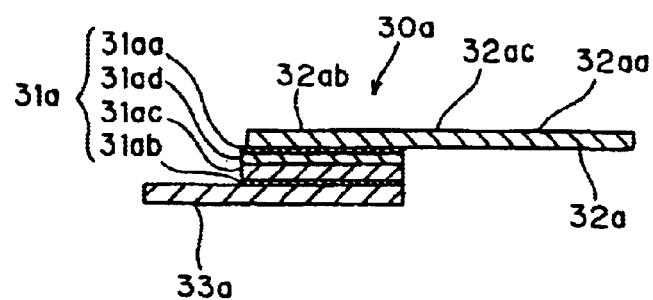
FIG. 8 is a section along 8—8 of FIG. 6.

A terminal box device for a solar cell module according to a second embodiment of the invention is identified by the numeral 20 in FIGS. 6 to 8. The terminal box device 20 is provided with a terminal box casing 21, three diodes 30a to 30c as rectifying elements, three terminal pairs, each of which includes one first terminal 25a to 25c and one second terminal 26a to 26c, and two radiating intermediate terminals 40a, 40b. Hatched portions in FIG. 6 are areas where a heat radiating effect is relatively high.

The terminal box casing 21 is made e.g. of a synthetic resin and includes a box main body 21a that has a substantially rectangular casing structure with an open end that defines an accommodating recess. A substantially plate-shaped lid (not shown) can be mounted on the opening of the box main body 21a to close the accommodating recess.

Wiring holes 22a are formed along one side (upper side in FIG. 6) of the bottom surface of the box main body 21a, and two cable introducing holes 22b are formed at substantially opposite ends of a side wall at the other side (lower side in FIG. 6) of the box main body 21a.

Ends of lead frames 16 are drawn out from the respective solar cells 4 (or the cell groups each comprised of a plurality of solar cells 4) of the solar cell module 1 and are pulled into the terminal box casing 21 through the wiring holes 22a. The connection cables 15 that connect the solar cell modules 1 or the connection cables 15 that transfer electric power from the solar cell module 1 to the outside are introduced through the respective cable introducing holes 22b and are pulled into the terminal box casing 21.

Two partition walls 24 are formed in the terminal box casing 21 for partitioning the accommodating recess into three diode accommodating spaces 23a to 23c one after another along the longitudinal direction LD. A single diode 30a to 30c is accommodated in each diode accommodating space 23a to 23c.

Radiating-intermediate-terminal insertion grooves 24a' are formed in the respective partition walls 24, and the radiating intermediate terminals 40a, 40b are inserted through the radiating-intermediate-terminal insertion grooves 24a' to extend between the adjacent diode accommodating spaces 23a to 23c. The radiating intermediate terminals 40a, 40b are exposed to allow an effective heat radiation or dissipation.

As shown in FIGS. 6 to 8, the diodes 30a to 30c include rectifying-element main bodies 31a to 31c, first lead terminals 32a to 32c to be connected electrically with anode electrodes 31aa of the rectifying-element main bodies 31a to 31c, and second lead terminals 33a to 33c to be connected electrically with cathode electrodes 31ab of the rectifying-element main bodies 31a to 31c.

Specifically, the rectifying-element main body 31a is formed by placing the cathode electrode 31ab, an n-type area 31ac, a p-type area 31ad and the anode electrode 31aa substantially one over another in this order and is in the form of a chip having a substantially square plan view.

The second lead terminal 33a is a plate having a substantially rectangular plan view. The rectifying-element main body 31a is arranged on the upper surface of one side of the second lead terminal 33a, and the cathode electrode 31ab of the rectifying-element main body 31a is to be connected electrically with the second lead terminal 33a, for example, by soldering.

The first lead terminal 32a includes a substantially rectangular lead-plate main body 32aa, and an element connecting portion 32ab with a substantially rectangular plan view substantially equal or similar to that of the rectifying-element main body 31ab in size. The rectifying-element main body 31a is arranged on the lower surface of the element connecting portion 32ab, and the anode electrode 31aa of the rectifying-element main body 31a is to be connected electrically with the element connecting portion 32ab, for example, by soldering. The first and second lead terminals 32a, 33a extend from the rectifying-element main body 31a in substantially opposite directions.

The first lead terminal 32a is made more easily resiliently deformable than the second lead terminal 33a. For example, the lead-plate main body 32aa and the element connecting portion 32ab may be coupled via a waist or thinned portion 32ac that has a reduced cross-sectional area. Thus, the first lead terminal 32a is easily resiliently deformable at the waist portion 32ac. Additionally or alternatively, the first lead terminal 32a may be thinner than the second lead terminal 33a. Thus, the entire first lead terminal 32a can flexibly and easily undergo a resilient deformation. Furthermore, slits 34' may extend from opposite sides in directions substantially normal to longitudinal direction LD in a portion of the lead-plate main body 32aa near the element main body 32ab. Thus, the first lead terminal 32a is made easily resiliently deformable at its portion where the one or more slits 34' are formed.

Thermal stress may be exerted on the diode 30a due to a change in ambient environment or heat developed by the rectifying-element main body 31a itself. However, stress on portions connecting the rectifying-element main body 31a and the respective lead terminals 32a, 33a can be taken up by making the first lead terminal 32a easily resiliently deformable. Thus, the connecting portions of the rectifying-element main body 31a and the respective lead terminals 32a, 33a will not peel off to cut off an electrical connection.

The first lead terminal 32a has the waist or thinned portion 32ac and the slits 34' or is thinned to easily undergo a resilient deformation. Thus, the sectional area of the first lead terminal 32a is made relatively smaller and has a lower thermal conductivity than the second lead terminal 33a.

The easily deformable first lead terminal 32 is connected with the anode electrode 31aa and the more rigid second lead terminal 33a is connected with the cathode electrode 31ab in this embodiment. However, a reverse arrangement may be taken.

It should be noted that the diodes 30b, 30c preferably have the same construction as the diode 30a.

One terminal pair is provided in each of the diode accommodating spaces 23a to 23c of the terminal box casing 21.

The first and second terminals 25a, 26a are fixed substantially side by side at a specified spacing in the diode accommodating space 23a at one side of the terminal box casing 21; the first and second terminals 25b, 26b are fixed substantially side by side at a specified spacing in the middle diode accommodating space 23b; and the first and second terminals 25c, 26c are fixed substantially side by side at a specified spacing in the diode accommodating space 23c at the other side of the terminal box casing 21. The positions of the first and second terminals 25b, 26b in the middle diode accommodating space 23b are reversed from those in the diode accommodating spaces 23a, 23c at the opposite sides. The respective first and second terminals 25a to 25c, 26a to 26c are fixed to the bottom of the terminal box casing 21 by fixing means using a known locking construction.

Each of the first and second terminals 25a to 25c, 26a to 26c is made of a conductive metallic into a substantially flat plate having a substantially rectangular plan view. In the respective diode accommodating spaces 23a to 23c, the first lead terminals 32a to 32c of the respective diodes 30a to 30c are connected electrically with the first terminals 25a to 25c, for example, by soldering, and the second lead terminals 33a to 33c thereof are connected electrically with the second terminals 26a to 26c, for example, by soldering.

One end of the first terminal 25a in the diode accommodating space 23a at one side, one end of each of the first and second terminals 25b, 26b in the middle diode accommodating space 23b, and one end of the second terminal 26c in the diode accommodating space 23c at the other side are connected with ends of the lead frames 16 drawn out from the respective solar cells 4 or cell groups of the solar cell module 1. Further, the other end of the first terminal 25a in the diode accommodating space 23a at one side and the other end of the second terminal 26c in the diode accommodating space 23c at the other side are connected with the external connection cables 15, for example, by crimping.

The radiating intermediate terminals 40a, 40b connect the first terminals 25a to 25c and the second terminals 26a to 26c to be connected with the adjacent diodes 30a to 30c so that the respective diodes 30a to 30c are connected in series. Specifically, each of the radiating intermediate terminals 40a, 40b is made of a conductive metallic into a substantially plate-shaped member having a substantially L- or U-shaped plan view. In this embodiment, the radiating intermediate terminals 40a, 40b are strips having substantially the same width as the first and second terminals 25a to 25c, 26a to 26c.

One end of the radiating intermediate terminal 40a at one side is connected with the second terminal 26a in the diode accommodating space 23a while the other end thereof is pulled into the middle diode accommodating space 23b through the radiating-intermediate-terminal insertion groove 24a' of the partition wall 24 and connected with the first terminal 25b therein. Further, one end of the radiating intermediate terminal 40b at the other side is connected with the first terminal 25c in the diode accommodating space 23c while the other end thereof is pulled into the middle diode accommodating space 23b through the radiating-intermediate-terminal insertion groove 24a' of the other partition wall 24 and connected with the second terminal 26b therein.

In this way, the respective diodes 30a to 30c are connected in series via the first terminals 25a to 25c, the second terminals 26a to 26c and the radiating intermediate terminals 40a, 40b.

The respective ends of the radiating intermediate terminals 40a, 40b and the first and second terminals 25a to 25c, 26a to 26c are connected to be easily electrically and thermally conductive. In this embodiment, the respective ends of the radiating intermediate terminals 40a, 40b and the first and second terminals 25a to 25c, 26a to 26c are fastened to the bottom of the terminal box casing 21 by fastening means such as screws while being placed one substantially over the other to establish a connection.

Heat developed by the diode 30a is transferred from the second lead terminal 33a having a relatively higher thermal conductivity to the second terminal 26a, then further to the first terminal 25b connected with the adjacent diode 30b via the radiating intermediate terminal 40a. The heat is radiated in these elements, particularly in the adjacent first terminal 25b. Thus, the diode 30a and connected elements have a good heat radiating property, thereby preventing an increase of the junction temperature of the diode 30a.

The connection cable 15 is connected with the first terminal 25a connected with the diode 30a. Thus, the heat of the first terminal 25a radiates to the outside via the connection cable 15 and, therefore, the first terminal 25a has a relatively good heat radiating property. Accordingly, a temperature difference between the diode 30a and the first terminal 25a becomes larger as the temperature of the diode 30a increases. Thus, heat is relatively easily transferred from the diode 30a to the first terminal 25a. In this respect as well, the temperature of the diode 30a is prevented from increasing.

Heat developed by the diode 30b is transferred from the second lead terminal 33b having a relatively higher thermal conductivity to the second terminal 26b, then further to the first terminal 25c connected with the adjacent diode 30c via the radiating intermediate terminal 40b. The heat is radiated in these elements, particularly in the adjacent first terminal 25c. Thus, the diode 30b and its connected elements have a good heat radiating property, thereby preventing an increase of the junction temperature of the diode 30b.

Heat developed by the diode 30c is transferred from the second lead terminal 33c having a relatively higher thermal conductivity to the second terminal 26c. The connection cable 15 is connected with the second terminal 26c. Thus, the heat radiates to the outside and is dissipated via the connection cable 15. Accordingly, the second terminal 26c has a higher heat radiating property than the other second terminals 26a, 26b. The transferred heat is radiated to the outside via the connection cable 15. Therefore the diode 30c and its connected elements have a good heat radiating property and an increase in the junction temperature of the diode 30c is prevented.

The first terminals 25a to 25c, the second terminals 26a to 26c and the radiating intermediate terminals 40a, 40b are substantially flat plates in this embodiment. Thus, heat is radiated efficiently in the respective elements.

The terminal box device has the three diodes 30a to 30c in the foregoing embodiment. However, the invention also is applicable to a terminal box device with two, four or more diodes.

A terminal box device for a solar cell module according to a third embodiment of the invention is described with reference to FIG. 9. It should be noted that the same or similar elements as those of the terminal box device described in the second embodiment are not described in this embodiment but merely are identified by the same reference numerals.

Figure 9:
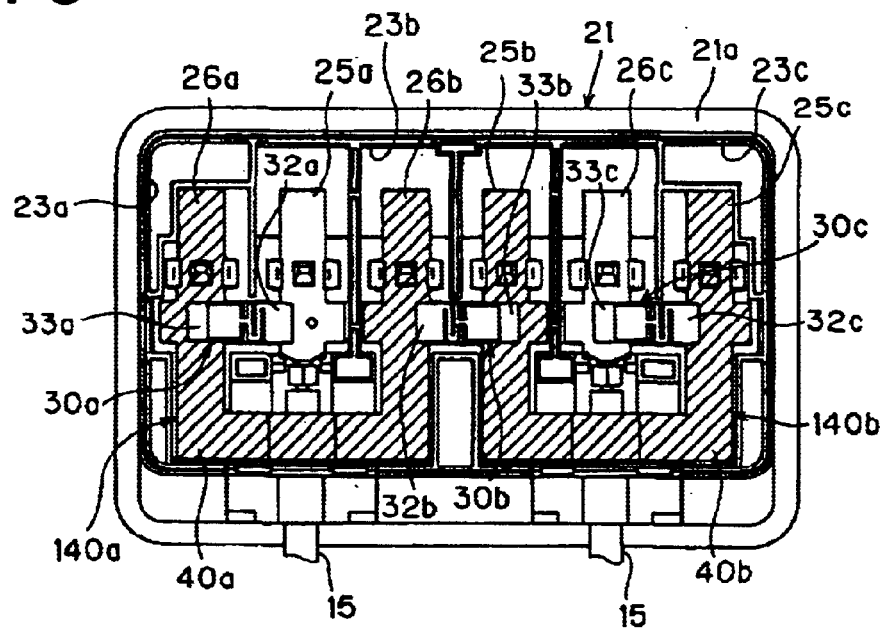
FIG. 9 is a schematic plan view of a terminal box device for a solar cell module according to a third embodiment.

The terminal box device of FIG. 9 has integrated radiating terminals 140a and 140b. The integrated radiating terminal 140a is an integral unit of the second terminal 26a, the first terminal 25b and the radiating intermediate terminal 40a of the second embodiment. The integrated radiating terminal 140b is an integral unit of the second terminal 26b, the first terminal 25c and the radiating intermediate terminal 40b of the second embodiment. These integrated radiating terminals 140a, 140b each are formed, for example, by stamping, cutting or forming one conductive metallic plate. The integrated radiating terminals 140a, 140b are exposed to the outside towards the opening of the terminal box casing 21 so that heat can be radiated effectively therefrom.

The terminal box device has the integrated radiating terminals 140a, 140b integral or unitary to the second terminals 26a, 26b, the first terminals 25b, 25c and the radiating intermediate terminals 40a, 40b. Thus, the number of steps of mounting these parts into the terminal box device is reduced. Further, the heat radiation from the diodes 30a to 30c is sufficient.

A terminal box device for a solar cell module according to a fourth embodiment of the invention is described with reference to FIGS. 10 to 13. It should be noted that the similar or same elements as those of the terminal box device described in the second and third embodiments are not described in this embodiment but are identified by the same reference numerals.

In the second and third embodiments, the first lead terminals 32a to 32c and the second lead terminals 33a to 33c are connected electrically with the first terminals 25a to 25c and the second terminals 26a to 26c, for example, by soldering. The first and second lead terminals 32a to 32c, 33a to 33c are constructed to have an improved heat radiating property by letting heat escape to the radiating intermediate terminals 40a, 40b as described above. Thus, a soldering operation using a soldering iron has a poor operability. For instance, a period of 20 seconds or longer is required for the soldering operation. In this way, a need to improve the heat radiating effect from the diodes 30a to 30c and a need to improve the soldering operation conflict with each other.

Figure 10:
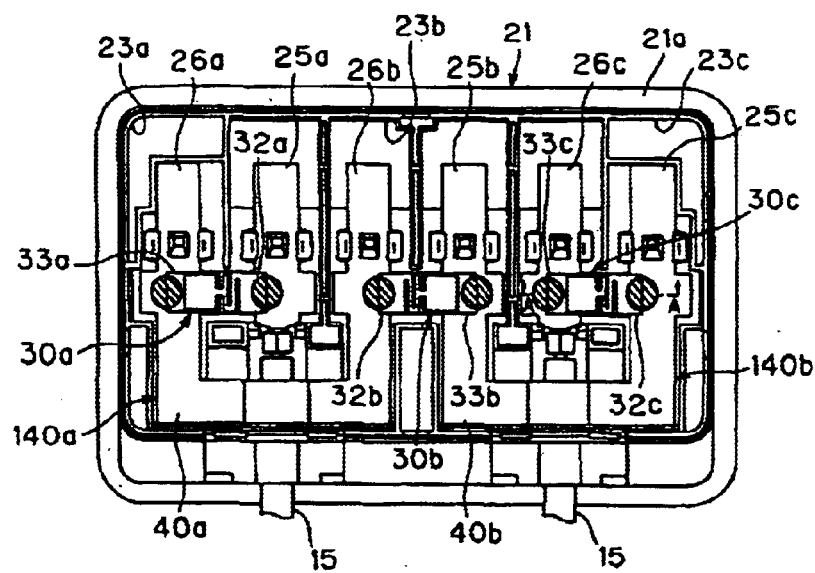
FIG. 10 is a schematic plan view of a terminal box device for a solar cell module according to a fourth embodiment.

Accordingly, a method is provided for connecting the first lead terminals 32a to 32c and the second lead terminals 33a to 33c of the respective diodes 30a to 30c with the first terminals 25b, 25c and the second terminals 26a, 26b of the integrated or unitary radiating terminals 140a, 140b, the other first terminal 25a and second terminal 25c (see round hatched portions in FIG. 10). The connecting method described here is similarly applicable to a case where the first terminals 25a to 25c and the second terminals 26a to 26c, which are elements separate from the radiating intermediate terminals 40a, 40b, are to be connected with the corresponding lead terminals 32a to 32c, 33a to 33c of the respective diodes 30a to 30c as in the second embodiment.

Figure 11:
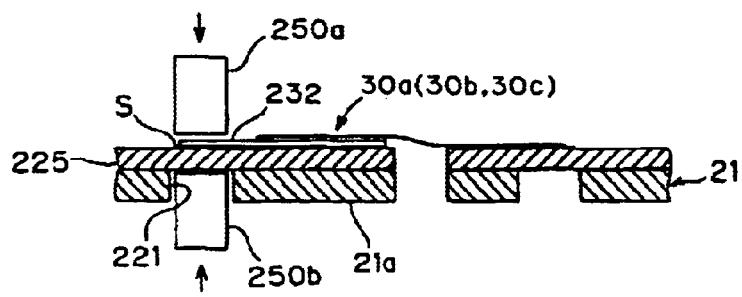
FIG. 11 is a schematic section showing a first connecting method for connecting a lead terminal and a terminal.
Figure 12:
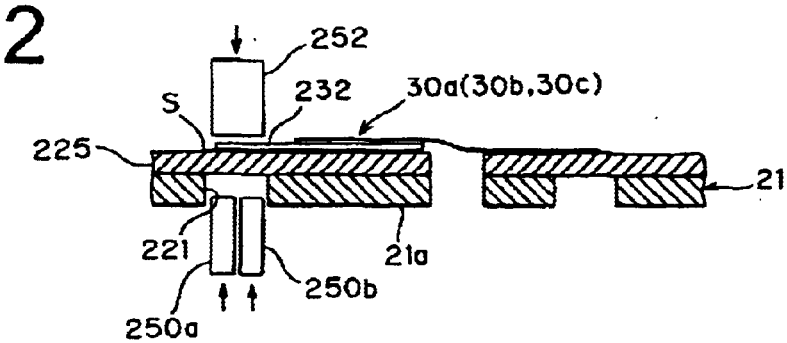
FIG. 12 is a schematic section showing another mode of the first connecting method.

According to this first connecting method, as shown in FIG. 11 or 12, one of the first and second terminals 25b, 25c, 26a, 26b of the integrated radiating terminals 140a, 140b and the first and second terminals 25a, 26c (hereinafter, this terminal is merely referred to as a terminal 225 in this embodiment) is accommodated in the body main body 21a of the terminal box casing 21, and a suitable amount of cream solder S is applied to a surface of an end of this terminal 225. An end of the corresponding one of the first lead terminals 32a to 32c and the second lead terminals 33a to 33c (hereinafter, this lead terminal is merely referred to as a lead terminal 232 in this embodiment) is placed on the surface of the end of the terminal 225 to fixedly accommodate the lead terminal 232 (diode 30a to 30c) in the box main body 21a of the terminal box casing 21. In this way, the terminal 225 and the lead terminal 232 are placed one substantially over the other with a solder present therebetween.

Then, the electrodes 250a, 250b are brought into contact with the terminal 225 and the lead terminal 232 placed one substantially over the other. In one mode, the electrodes 250a, 250b arranged at the opposite sides of the terminal 225 and the lead terminal 232 are brought into contact with the terminal 225 and the lead terminal 232 to press them from opposite sides as shown in FIG. 11. In another mode, the pair of electrodes 250a, 250b are arranged close to each other while defining a suitable spacing therebetween, and the terminal 225 and the lead terminal 232 placed one substantially over the other are pressed from opposite sides by the pair of electrodes 250a, 250b at one side and a pressing jig 252 at the other side as shown in FIG. 12.

Operation holes 221 are formed in portions of the box main body 21a where the terminal 225 and the lead terminal 232 are to be connected. The electrodes 250a, 250b and the like are brought into contact with the terminal 225 and the lead terminal 232 through the operation holes 221.

Subsequently, pressure is applied to the pair of electrodes 250a, 250b to press the terminal 225 and the lead terminal 232. A specified large current is applied between the electrodes 250a, 250b, thereby locally increasing the temperatures of the terminal 225, the lead terminal 232 and the solder S between them within a short period. A current is applied either in a downward direction or in upward direction. In this way, the cream solder S is melted to solder the terminal 225 and the lead terminal 232.

Figure 13:
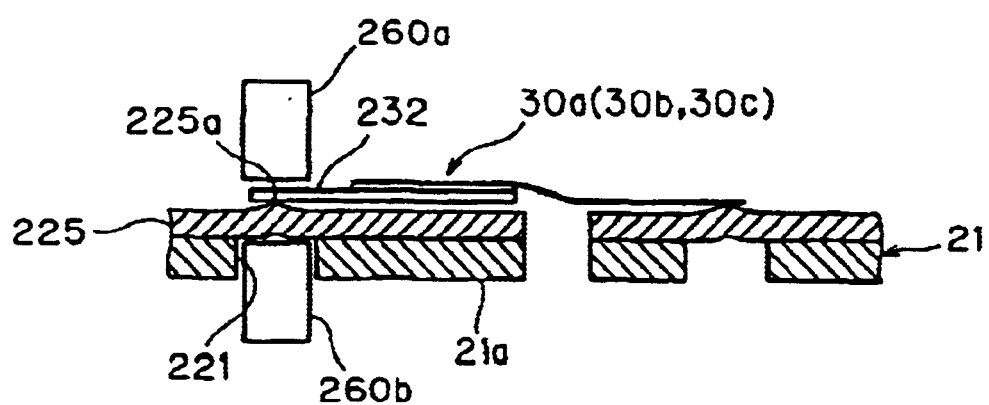
FIG. 13 is a schematic section showing a second connecting method for connecting the lead terminal and the terminal.

A second connecting method joins the terminal 225 and the lead terminal 232 by resistance-welding. Specifically, as shown in FIG. 13, the terminal 225 is accommodated in the box main body 21a and an end of the lead terminal 232 is placed on an end of the terminal 225, thereby fixing the lead terminal 232 in the box main body 21a. In this way, the terminal 225 and the lead terminal 232 are placed one substantially over the other.

Electrodes 260a, 260b for resistance welding then are brought into contact with the terminal 225 and the lead terminal 232 placed one substantially over the other from opposite sides. Similar to the first connecting method, operation holes 221h may be formed in portions of the box main body 21a where the terminal 225 and the lead terminal 232 are to be connected.

Pressure is applied to the electrodes 260a, 260b to press the terminal 225 and the lead terminal 232 from substantially opposite sides, and a specified large current is applied between them. Thus, the terminal 225 and the lead terminal 232 are melted and joined by developed heat (Joule heat). It should be noted that a current may be applied either down or up.

At this time, the terminal 225 may have a protuberance 225a projecting toward the lead terminal 232 to concentrate the current. Alternatively or additionally the lead terminal 232 may be formed with a protuberance.

According to the above connecting methods, the lead terminal 232 and the terminal 225 are soldered by applying a current between the electrodes 250a, 250b to heat the cream solder S between the lead terminal 232 and the terminal 225. Alternatively, the lead terminal 232 and the terminal 225 are joined by resistance welding by applying a current between the electrodes 260a, 260b for resistance welding. Thus, the connecting operation can be performed within a relatively short period of, e.g. about 5 seconds.

Further, the connecting operation can be mechanized to be more efficiently performed.

What is claimed is:

1. A terminal box device to be equipped for a solar cell module, comprising:

a terminal box casing, and a plurality of connecting terminals arranged in the terminal box casing and connected with a plurality of connecting elements from photoelectric conversion elements of the solar cell module, wherein:

two of the plurality of connecting terminals are adapted to be connected with a pair of connection cables so that the connection cables can be drawn out from the terminal box casing, the terminal box casing comprises a plurality of accommodating spaces for accommodating a plurality of rectifying elements to be electrically connected between the adjacent connecting terminals, and the respective rectifying elements are connected in series via intermediate terminal mount(s) in the terminal box casing.

2. The terminal box device of claim 1, further comprising at least one partition wall partitioning the accommodating spaces for accommodating the respective rectifying elements.

3. The terminal box device of claim 2, wherein a filler is disposed in the terminal box casing and an air layer is inside the partition wall.

4. The terminal box device of claim 1, wherein the connecting terminals are arranged substantially side by side substantially at even intervals and the intermediate terminal mount(s) are arranged at the outer sides of the respective connecting terminals.

5. The terminal box device of claim 1, wherein a pin-shaped connecting member is used as a connecting member between the intermediate terminal mount and the connecting terminal to be connected with the intermediate terminal mount.

6. The terminal box device of claim 1, wherein a non-linear connecting member is used as a connecting member between the intermediate terminal mount and the connecting terminal to be connected with the intermediate terminal mount.

7. The terminal box device of claim 6, wherein a part of the nonlinear connecting member is outside the terminal box casing.

8. A terminal box device for a solar cell module, comprising:

a terminal box casing, a plurality of rectifying element accommodating spaces for a plurality of rectifying elements each including a main body, a first lead terminal and a second lead terminal having better thermal conductivity than the first lead terminal, a plurality of terminal pairs corresponding to the number of the rectifying elements, each terminal pair including a first terminal to be connected with the first lead terminal and a second terminal to be connected with the second lead terminal, and at least one radiating intermediate terminal for connecting at least one pair of the first and second terminals to be connected with the adjacent rectifying elements such that the respective rectifying elements are connected in series.

9. The terminal box device of claim 8, wherein the first lead terminal is substantially in the form of a plate, and the second lead terminal is made to have a better thermal conductivity than the first lead terminal by forming the first lead terminal to have a smaller cross-sectional area than the second lead terminal.

10. The terminal box device of claim 9, wherein the first terminal, the second terminal and the radiating intermediate terminal are substantially flat plates.

11. The terminal box device of claim 8, wherein the radiating intermediate terminal is integral with at least one of the first and second terminals for intermediate connection.

12. A method for connecting a lead terminal and a terminal in a terminal box casings of a terminal box device for a solar cell module, the terminal box casing having a plurality of rectifying elements each including the lead terminal and the terminal to be connected with the lead terminal, the method comprising:

placing the lead terminal and the terminal one over the other with a solder therebetween and, holding a pair of electrodes in contact with the lead terminal and the terminal, applying a current between the electrodes to heat the solder, thereby soldering the lead terminal and the terminal.

13. The connecting method of claim 12, wherein operation holes are formed in portions of the terminal box casing where the lead terminal and the terminal are to be connected, and wherein the method further comprises bringing the pair of electrodes into contact with the lead terminal and the terminal through the operation holes, thereby connecting the lead terminal and the terminal by soldering.

14. A method for connecting a lead terminal and a terminal in a terminal box casing of a terminal box device for a solar cell module, the terminal box casing having a plurality of rectifying elements each including the lead terminal and the terminal to be connected with the lead terminal, the method comprising:

placing the lead terminal and the terminal one over the other and, holding a pair of electrodes in contact with the lead terminal and the terminal, applying a current between the pair of electrodes to connect the lead terminal and the terminal by resistance welding.

* * * * *

UNITED STATES PATENT AND TRADEMARK OFFICE
CERTIFICATE OF CORRECTION

PATENT NO. : 6,828,503 B2  Page 1 of 1
DATED : December 7, 2004
INVENTOR(S) : Hiroyuki Yoshikawa et al.

It is certified that error appears in the above-identified patent and that said Letters Patent is hereby corrected as shown below:

<u>Title page</u>,
Item [75], Inventors, should read:
-- [75] Inventors:  Hiroyuki Yoshikawa, Yokkaichi-City, Japan
                    Makoto Higashikozono, Yokkaichi-City, Japan
                    Tadahi Sugino, Yokkaichi-City, Japan --

Signed and Sealed this

First Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,828,503 B2
DATED : December 7, 2004
INVENTOR(S) : Hiroyuki Yoshikawa et al.

It is certified that error appears in the above-identified patent and that said Letters Patent is hereby corrected as shown below:

<u>Title page,</u>
Item [75], Inventors, should read:
-- [75] Inventors: Hiroyuki Yoshikawa, Yokkaichi-City, Japan
                 Makoto Higashikozono, Yokkaichi-City, Japan
                 Tadashi Sugino, Yokkaichi-City, Japan --

This certificate supersedes Certificate of Correction issued March 1, 2005.

Signed and Sealed this

Sixteenth Day of August, 2005

JON W. DUDAS
*Director of the United States Patent and Trademark Office*